(12) United States Patent
Shim et al.

(10) Patent No.: US 7,250,685 B2
(45) Date of Patent: Jul. 31, 2007

(54) ETCHED LEADFRAME FLIPCHIP PACKAGE SYSTEM

(75) Inventors: Il Kwon Shim, Singapore (SG); Sheila Marie L. Alvarez, Singapore (SG); Hin Hwa Goh, Singapore (SG); Robinson Quiazon, Singapore (SG)

(73) Assignee: Stats Chippac Ltd., Singapore (SG)

(*) Notice: Subject to any disclaimer, the term of this patent is extended or adjusted under 35 U.S.C. 154(b) by 0 days.

(21) Appl. No.: 11/307,384

(22) Filed: Feb. 4, 2006

(65) Prior Publication Data
US 2007/0108565 A1 May 17, 2007

Related U.S. Application Data

(60) Provisional application No. 60/595,830, filed on Aug. 9, 2005.

(51) Int. Cl.
*H01L 23/48* (2006.01)
(52) U.S. Cl. .................... 257/778; 257/E23.031; 438/108
(58) Field of Classification Search ............... 257/778
See application file for complete search history.

(56) References Cited

U.S. PATENT DOCUMENTS

| | | | |
|---|---|---|---|
| 6,507,120 B2* | 1/2003 | Lo et al. ................. | 257/778 |
| 6,577,012 B1 | 6/2003 | Greenwood et al. ...... | 257/766 |
| 6,750,546 B1* | 6/2004 | Villanueva et al. ...... | 257/778 |
| 6,818,973 B1* | 11/2004 | Foster .................. | 257/676 |
| 6,867,072 B1 | 3/2005 | Shiu et al. ............. | 438/123 |
| 7,005,325 B2* | 2/2006 | Chow et al. ............ | 438/123 |
| 2003/0203539 A1* | 10/2003 | Islam et al. ............ | 438/111 |
| 2005/0156296 A1 | 7/2005 | Wang et al. ............ | 257/673 |
| 2005/0224940 A1 | 10/2005 | Tangpuz et al. ........ | 257/678 |
| 2005/0236701 A1* | 10/2005 | Minamio et al. ........ | 257/676 |
| 2005/0258521 A1* | 11/2005 | Park et al. ............. | 257/670 |
| 2005/0287705 A1* | 12/2005 | Yang .................... | 438/108 |

* cited by examiner

*Primary Examiner*—Leonardo Andujar
*Assistant Examiner*—Krista Soderholm
(74) *Attorney, Agent, or Firm*—Mikio Ishimaru

(57) ABSTRACT

The present invention provides an etched leadframe flipchip package system comprising forming a leadframe comprises forming contact leads and etching a plurality of multiple dotted grooves on the contact leads, and attaching a flipchip integrated circuit having solder interconnects on the contact leads between each of the plurality of the multiple dotted grooves.

20 Claims, 7 Drawing Sheets

ETCHED LEADFRAME FLIPCHIP PACKAGE SYSTEM

CROSS-REFERENCE TO RELATED APPLICATION(S)

This application claims the benefit of U.S. Provisional Patent Application Ser. No. 60/595,830 filed Aug. 9, 2005, and the subject matter thereof is hereby incorporated herein by reference thereto.

TECHNICAL FIELD

The present invention relates generally to integrated circuit package systems, and more particularly to a system for manufacturing a flip-chip integrated circuit package system.

BACKGROUND ART

As the electronics industry progresses integrated circuit (IC) products are shrinking in size. The applications supported by these IC's are becoming more powerful with ever increasing features and functions. This is exemplified as the telephone was transformed into the cellular phone and most recently into the camera phone. All the while these devices continue to shrink in size. Other devices that have evolved include computers, memory devices, personal music players and personal data assistants (PDA's). Each is operated by an integrated circuit die.

An IC die is a small device formed on a semiconductor wafer, such as a silicon wafer. A leadframe is a metal frame that usually includes a paddle that supports an IC die that has been cut from the wafer. The leadframe has lead fingers that provide external electrical connections. That is, the die is attached to the die paddle and then bonding pads of the die are connected to the lead fingers via wire bonding or flip chip bumping to provide the external electrical connections. Encapsulating the die and wire bonds or flip chip bump with a protective material forms a package. Depending on the package type, the external electrical connections may be used as-is, such as in a Thin Small Outline Package (TSOP), or further processed, such as by attaching spherical solder balls for a Ball Grid Array (BGA). These terminal points allow the die to be electrically connected with other circuits, such as on a printed circuit board.

Use of packaged ICs is widespread. Moreover, the size and cost of electronic devices puts continuous pressure on the need for small, yet less costly packaged ICs. Furthermore, for high bandwidth RF devices and high operating frequency devices, there is a push for shorter electrical paths inside the IC package. Flip chip bonding can replace the traditional wire bonding interconnection.

There are also manufacturing issues that plague the flipchip assembly process. With the attachment of the flipchip solder balls to the leadframe or substrate, the IC die has a tendency to move during the reflow connection. As the solder becomes viscous, the die can be moved by the surface tension in the liquid solder. Due to the small size of the IC die, it is difficult to hold the IC die in a fixed position. Any movement during the attachment process can cause a package failure and reduced yield.

A key component in the die attach process is the leadframe preparation. As the solder liquefies, during reflow, it will flow to any surface that will bond with it. Preparing a leadframe for flipchip attachment can be a meticulous and costly process. Thus, it is desirable to provide an inexpensive method of flip chip interconnection packaging ICs. It also is desirable to have a method of decreasing the size of such packaged ICs.

Thus, a need still remains for a reliable high volume capable process for flipchip assembly on leadframe packages. In view of the demand for high volume low profile packages, it is increasingly critical that answers be found to these problems. The ever increasing need to save costs and improve efficiencies, makes it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an etched leadframe flipchip package system comprising forming a leadframe comprises forming a die paddle, forming contact leads around the die paddle, forming tie bars to the die paddle and etching a plurality of multiple dotted grooves on the contact leads, and attaching a flipchip integrated circuit, having solder interconnects, to the leadframe, wherein the solder interconnects on the contact leads between the each of the plurality of the multiple dotted grooves.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
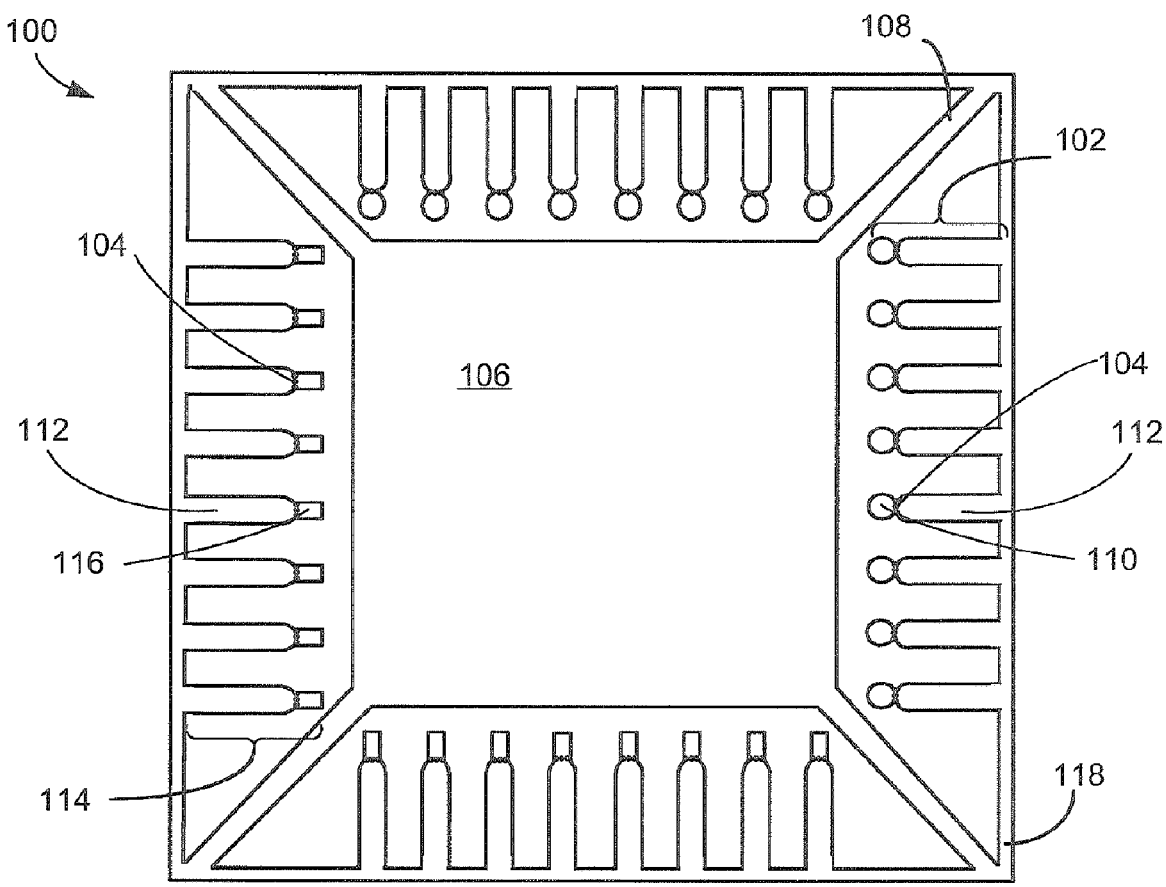
FIG. 1 is a plan view of an etched leadframe flipchip package system, in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGS. Also, where multiple embodiments are disclosed and described having some features in common for clarity and ease of illustration, description, and comprehension thereof, similar and like features one to another will ordinarily be described with like reference numerals.

The term "horizontal" as used herein is defined as a plane parallel to the conventional plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material or photoresist, patterning, exposure, development, etching, cleaning, and/or removal of the material or photoresist as required in forming a described structure.

Referring now to FIG. 1, therein is shown a plan view of an etched leadframe flipchip package system 100, in an embodiment of the present invention. The etched leadframe flipchip package system 100 includes contact leads 102, having multiple dotted grooves 104, a die paddle 106, with tie bars 108 attached at the corners of the die paddle 106. The contact leads 102 have the multiple dotted grooves 104, a solder ball contact 110 and an external contact lead 112. Also displayed are alternate contact leads 114 having the multiple dotted grooves 104, a rectangular solder contact 116 and the external contact lead 112. It is understood that the etched leadframe flipchip package system 100 may contain any combination of the contact leads 102 and the alternate contact leads 114. The tie bars 108, the contact leads 102 and the alternate contact leads 114 are attached to a leadframe support strip 118 during assembly. The leadframe support strip 118 is removed in a singulation process.

The tie bars 108, the contact leads 102 and the alternate contact leads 114 may be formed in any number of processes, such as half etching. The half etch process removes some of the material, such as a dual gauge copper alloy, from the bottom of the tie bars 108, the contact leads 102 and the alternate contact leads 114. The multiple dotted grooves 104 are a series of etched dots of a controlled depth in the contact leads 102 in the range between 25 μm and 60 μm deep. The etched dots forming the multiple dotted grooves 104 may slightly overlap or may be spaced a maximum of 25 μm apart.

Figure 2:
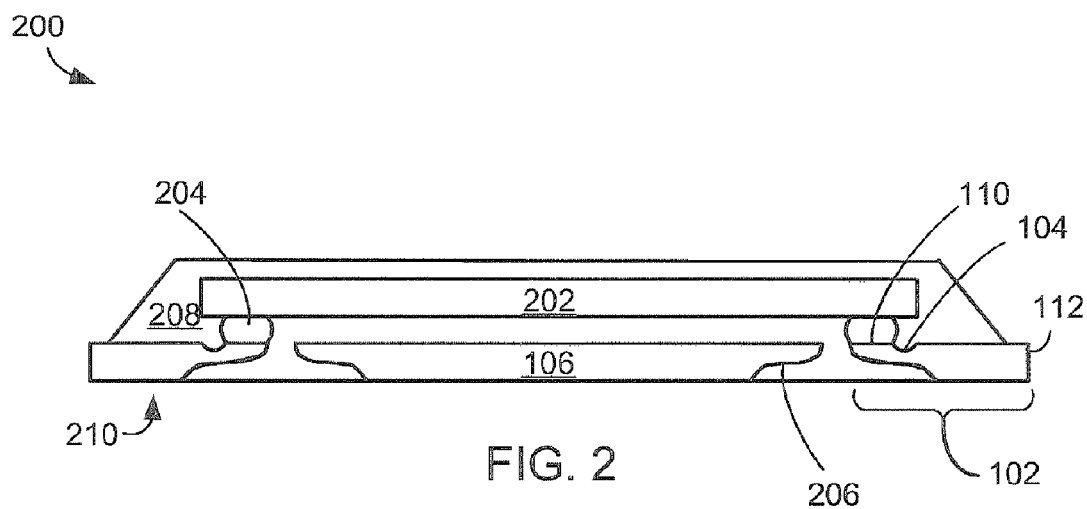
FIG. 2 is a cross-sectional view of an integrated circuit package, including the etched leadframe of FIG. 1.

Referring now to FIG. 2, therein is shown a cross-sectional view of an integrated circuit package system 200 utilizing the etched leadframe flipchip package system 100 of FIG. 1. The cross-sectional view of the integrated circuit package system 200 depicts an integrated circuit 202, such as an active circuit or an integrated power device (IPD), having solder interconnects 204 attached to the solder ball contact 110. The solder interconnects 204 are shown as solder balls, but it is understood that they may be stud bumps or solder column interposers.

The multiple dotted grooves 104 form a solder isolation barrier for the reflow process. The surface tension of the solder interconnects 204 maintains the substantially ball shape and height during attachment of the integrated circuit 202 to the solder ball contact 110. An etched surface 206 is the result of the half etch process that facilitates flow of a molding compound 208 during the package molding phase of manufacturing. The half etch process substantially reduces the thickness of the contact leads 102 and the die paddle 106 to approximately half of the initial thickness of the contact leads 102.

The contact leads 102 may become partially encased in the molding compound 208. The external contact lead 112 protrudes from the molding compound 208 and forms a package connection surface 210. The integrated circuit package system 200 is shown as a flipchip quad leadless package (FC-QLP) utilizing the etched leadframe flipchip package system 100. The package connection surface 210 is used to attach the integrated circuit package system 200 to the next higher assembly (not shown), such as a printed circuit board.

Figure 3:
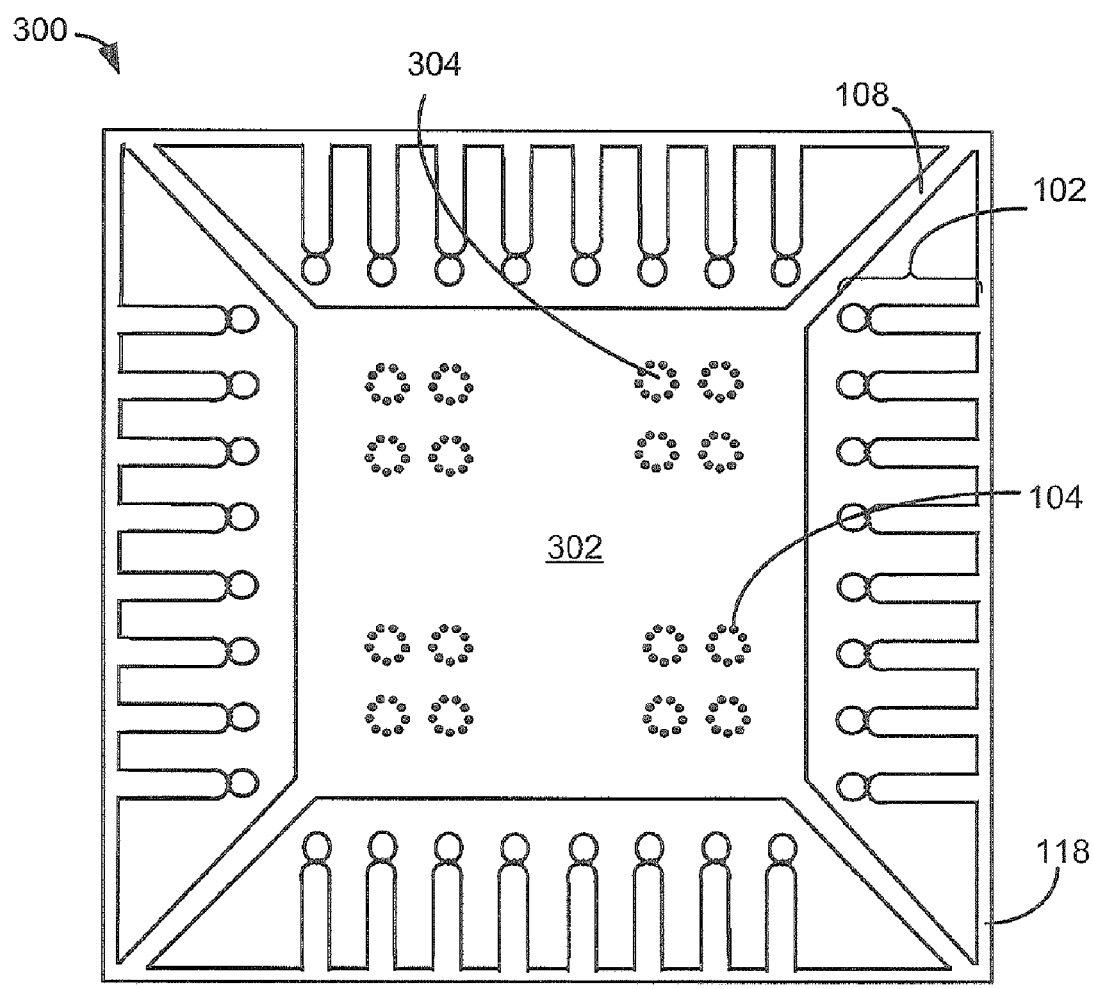
FIG. 3 is a plan view of an etched leadframe in an alternative embodiment of the present invention.

Referring now to FIG. 3, therein is shown a plan view of an etched leadframe flipchip package system 300, in an alternative embodiment of the present invention. The etched leadframe flipchip package system 300 includes an alternative die paddle 302 having a solder containment surface 304. The solder containment surface 304 is bordered by a plurality of the multiple dotted grooves 104 arranged in a geometric shape, such as a circle. Each of the plurality of the multiple dotted grooves 104 is spaced no greater than 25 μm from each other. This spacing is used to prevent seepage of the solder during the reflow process.

The contact leads 102 are arranged around the alternative die paddle 302, which has the tie bars 108 attached at the corners. The tie bars 108 connect the alternative die paddle 302 to the leadframe support strip 118. The leadframe support strip 118 also supports the contact leads 102.

Figure 4:
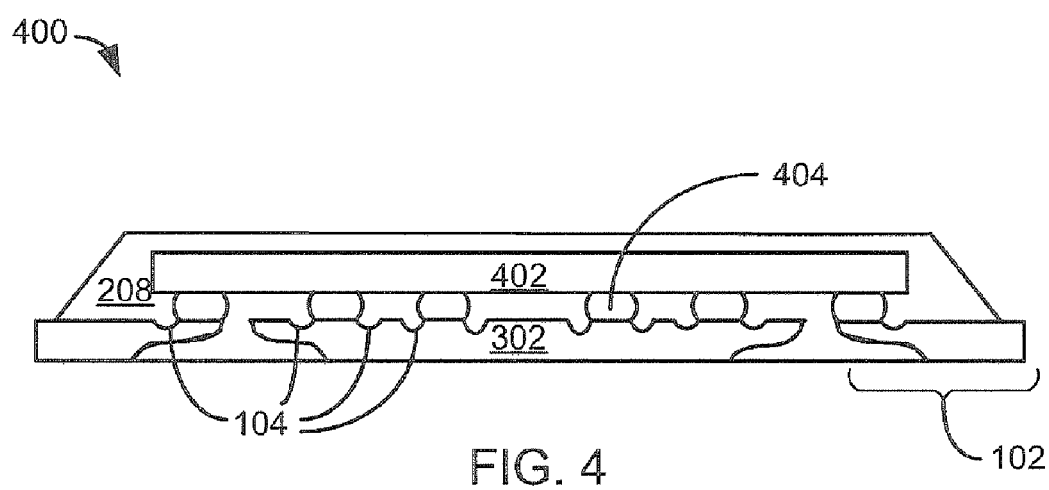
FIG. 4 is a cross-sectional view of an integrated circuit package system, including the etched leadframe flipchip package system of FIG. 3.

Referring now to FIG. 4, therein is shown a cross-sectional view of an integrated circuit package system 400, including the etched leadframe flipchip package system 300 of FIG. 3. The cross-sectional view of the integrated circuit package system 400 depicts an integrated circuit 402 attached, to the alternative die paddle 302 and the contact leads 102, in a flipchip configuration, by interconnects 404, such as solder balls, stud bumps or solder column interposers. Each of the interconnects 404 is bordered by the plurality of the multiple dotted grooves 104. In the solder reflow phase of manufacturing, the multiple dotted grooves 104 act as a solder barrier to keep the molten solder in a substantially ball configuration, by constraining it within the limits of the multiple dotted grooves 104. The surface tension of the solder holds the substantially rounded configuration that prevents the interconnects 404 from collapsing. The result is a uniform and reliable connection between the integrated circuit 402, the alternative die paddle 302 and the contact leads 102.

The molding compound 208 encapsulates the integrated circuit 402, the interconnects 404, the alternative die paddle 302 and the contact leads 102. The alternative die paddle 302 and the contact leads 102 are partially half etched. This allows smooth flow of the molding compound 208 during the encapsulation phase of manufacturing. The alternative die paddle 302 may be implemented as a heat sink for the integrated circuit 402, when it is attached to a printed circuit board (not shown).

Figure 5:
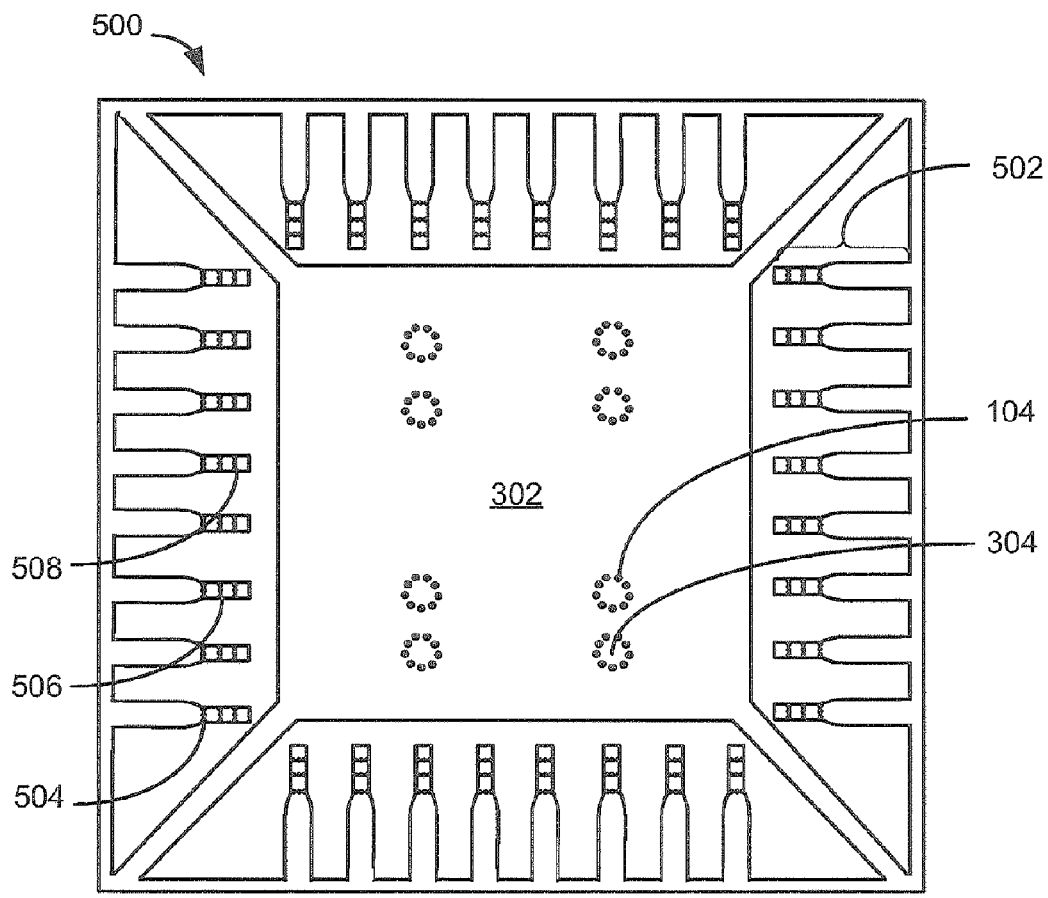
FIG. 5 is a plan view of an etched leadframe flipchip package system, in another alternative embodiment of the present invention.

Referring now to FIG. 5, therein is shown a plan view of an etched leadframe flipchip package system 500, in another alternative embodiment of the present invention. The etched leadframe flipchip package system 500 includes a three element contact lead 502, the alternative die paddle 302 having the solder containment surface 304. The solder containment surface 304 is bordered by the plurality of the multiple dotted grooves 104 arranged in a geometric shape, such as a circle. Each of the plurality of the multiple dotted grooves 104 is spaced no greater than 25 μm from each other. This spacing is used to prevent seepage of the solder during the reflow process.

The three element contact lead 502 has three sets of the multiple dotted grooves 104 for attachment of circuit components (not shown). The three sets are a first groove row 504, a second groove row 506, and a third groove row 508 allowing for additional contact sites or alternative contact sites for different sized integrated circuits (not shown).

Figure 6:
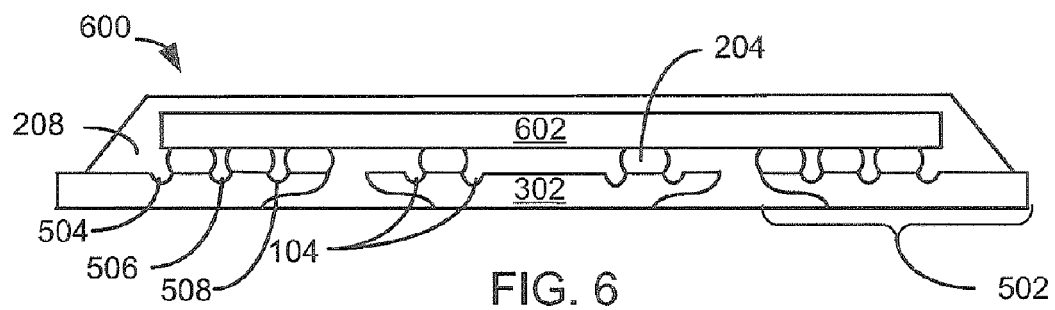
FIG. 6 is a cross-sectional view of an integrated circuit package system including the etched leadframe flipchip package system of FIG. 5.

Referring now to FIG. 6, therein is shown a cross-sectional view of an integrated circuit package system 600 including the etched leadframe flipchip package system 500 of FIG. 5. The cross-sectional view of the integrated circuit package system 600 depicts an integrated circuit 602, such as an active circuit or an integrated power device (IPD), having the solder interconnects 204 attached to the alternative die paddle 302 and the three element contact lead 502. The solder interconnects 204 are shown as solder balls, but it is understood that they may be stud bumps or solder column interposers.

The three element contact lead 502 supports three of the solder interconnects 204 separated by the plurality of the multiple dotted grooves 104. The plurality of the multiple dotted grooves 104 forms a solder barrier and constrains the shape of the solder interconnects 204 due to the surface tension of the solder in the molten state.

The molding compound 208 encapsulates the integrated circuit 602, the solder interconnects 204, the alternative die paddle 302 and the three element contact lead 502. The alternative die paddle 302 and the three element contact lead 502 are partially half etched. This allows flow of the molding compound 208 during the encapsulation phase of manufacturing.

Figure 7:
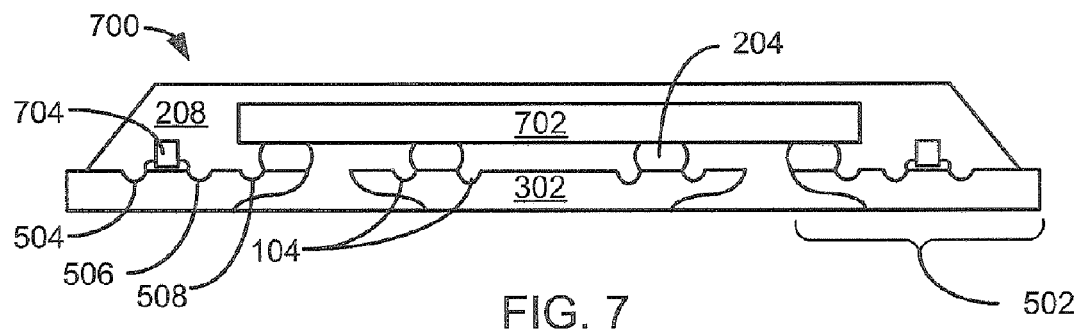
FIG. 7 is a cross-sectional view of an integrated circuit package system, including the etched leadframe flipchip package system of FIG. 5.

Referring now to FIG. 7, therein is shown a cross-sectional view of an integrated circuit package system 700, including the etched leadframe flipchip package system 500 of FIG. 5. The cross-sectional view of the integrated circuit package system 700 depicts a flipchip integrated circuit 702, such as an active circuit or an integrated power device (IPD), having the solder interconnects 204 attached to the alternative die paddle 302 and the three element contact lead 502. The solder interconnects 204 are shown as solder balls, but it is understood that they may be stud bumps or solder column interposers.

The three element contact lead 502 supports one of the solder interconnects 204 separated by the plurality of the multiple dotted grooves 104 and a passive component 704, such as an inductor, a capacitor or a resistor. The multiple dotted grooves 104 form a solder barrier and constrains the shape of the solder interconnects 204 due to the surface tension of the solder in the molten state.

The molding compound 208 encapsulates the flipchip integrated circuit 702, the solder interconnects 204, the alternative die paddle 302, and the three element contact lead 502. The alternative die paddle 302 and the three element contact lead 502 are partially half etched. This allows flow of the molding compound 208 during the encapsulation phase of manufacturing.

Figure 8:
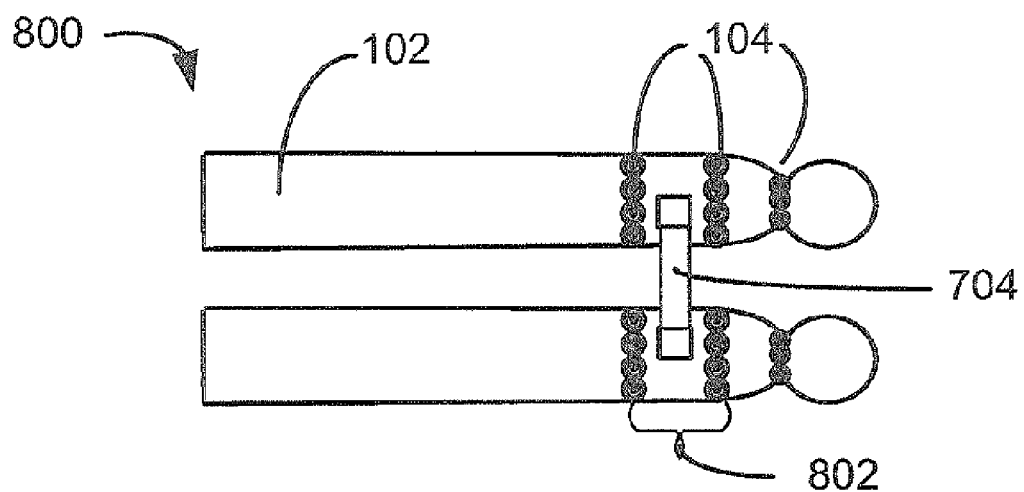
FIG. 8 is a more detailed plan view of the contact leads with the passive component attached, on fine pitch.

Referring now to FIG. 8, therein is shown a more detailed plan view of the contact leads 102 with the passive component 704 attached, on fine pitch. The plan view depicts the passive component 704 attached between an adjacent pair of the contact leads 102, on fine pitch. The fine pitch spacing is such that the passive component 704 will reach across the space between the contact leads 102. The passive component 704 is positioned between the plurality of the multiple dotted grooves 104 arranged across the width of the contact leads 102. The plurality of the multiple dotted grooves 104 forms a component pad 802 on the contact leads 102.

Figure 9:
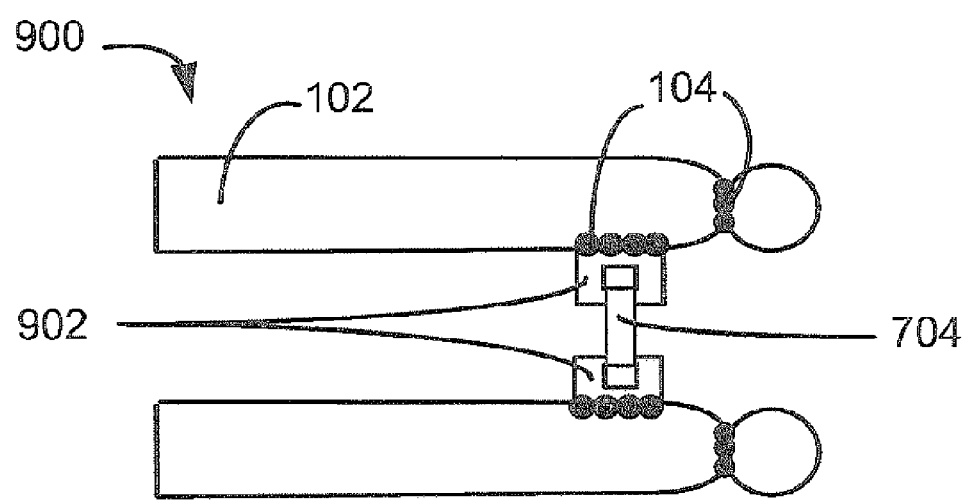
FIG. 9 is a more detailed plan view of the contact leads with the passive component attached, on wide pitch.

Referring now to FIG. 9, therein is shown a more detailed plan view of the contact leads 102 with the passive component 704 attached, on wide pitch. The more detailed plan view depicts the passive component 704 attached between an adjacent pair of the contact leads 102, on wide pitch. The wide pitch spacing is such that the passive component 704 will not reach across the space between the contact leads 102. In this case, a lead tab 902 is designed into each of the contact leads 102 supporting the passive component 704. The lead tab 902 has the plurality of the multiple dotted grooves 104 aligned with the contact leads 102. The multiple dotted grooves 104 act as a solder barrier during the reflow process. This assures proper wetting of the contacts of the passive component 704 and reliable connection to the lead tab 902.

Figure 10:
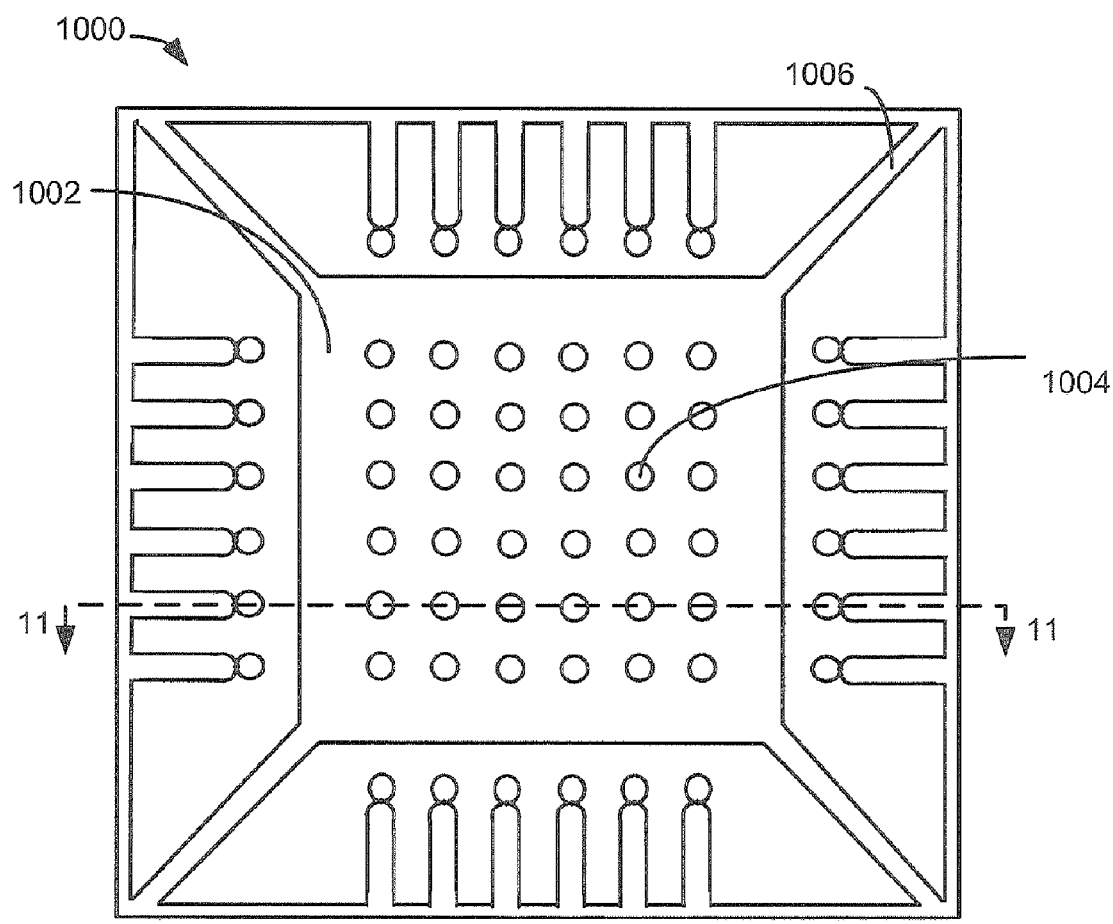
FIG. 10 is a plan view of an etched leadframe flipchip package system in another alternative embodiment of the present invention.

Referring now to FIG. 10, therein is shown a plan view of an etched leadframe flipchip package system 1000 in an alternative embodiment of the present invention. The plan view of the etched leadframe flipchip package system 1000 includes a half etched die paddle 1002, thermal contacts 1004 and half etched tie bars 1006. The half etched die paddle 1002 is selectively patterned with the thermal contacts 1004, in geometric shapes, such as circles, that align with thermal pads on the flipchip die (not shown). The etching of the half etched die paddle 1002 and the half etched tie bars 1006 is performed by a chemical deflashing of the top surface of the leadframe paddle (not shown). The plan view of the etched leadframe flipchip package system 1000 also includes a section line 11-11 that shows the section view of FIG. 11.

Figure 11:
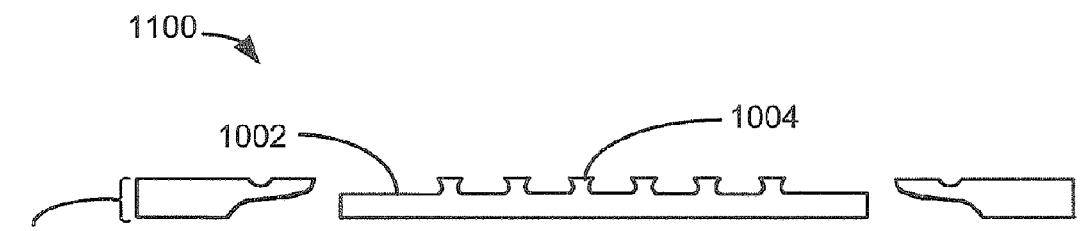
FIG. 11 is a cross-sectional view of the etched leadframe flipchip package system along the line 11-11 of FIG. 10.

Referring now to FIG. 11, therein is shown a cross-sectional view of the etched leadframe flipchip package system 1000 along the line 11-11 of FIG. 10. The cross-sectional view depicts the half etched die paddle 1002, having the thermal contacts 1004 extending in the range between 25 μm and 60 μm above the etched level of the half etched die paddle 1002. The cross-sectional view depicts a limited number of the thermal contacts 1004, but it is understood that this is for example only and the actual number of the thermal contacts 1004 may vary.

Figure 12:
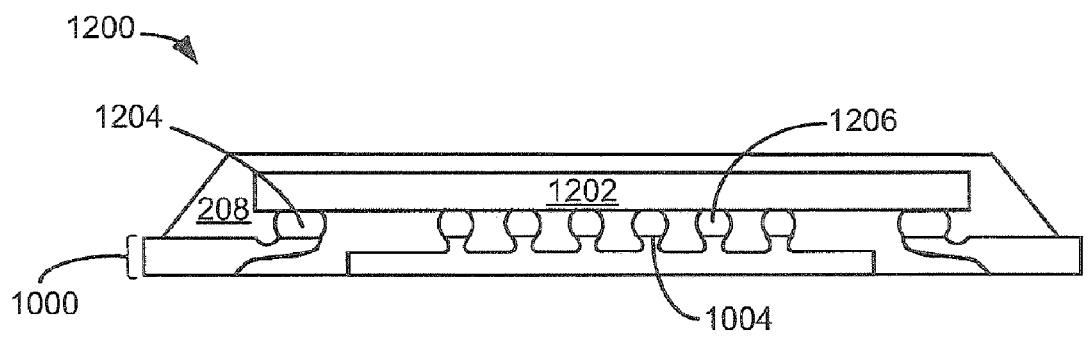
FIG. 12 is a cross-sectional view of an integrated circuit package system, including the etched leadframe flipchip package system of FIG. 10.

Referring now to FIG. 12, therein is shown a cross-sectional view of an integrated circuit package system 1200, including the etched leadframe flipchip package system 1000 of FIG. 10. The cross-sectional view depicts an integrated circuit 1202 and signal connections 1204, such as solder balls, solder columns or stud bumps. The cross-sectional view also depicts thermal interconnects 1206, such as solder balls, solder columns or stud bumps, attached between the integrated circuit 1202 and the thermal contacts 1004 of the etched leadframe flipchip package system 1000. This configuration allows containment of the solder ball spread in the reflow process and it allows an unobstructed flow area for the molding compound 208 in the encapsulation process.

Figure 13:
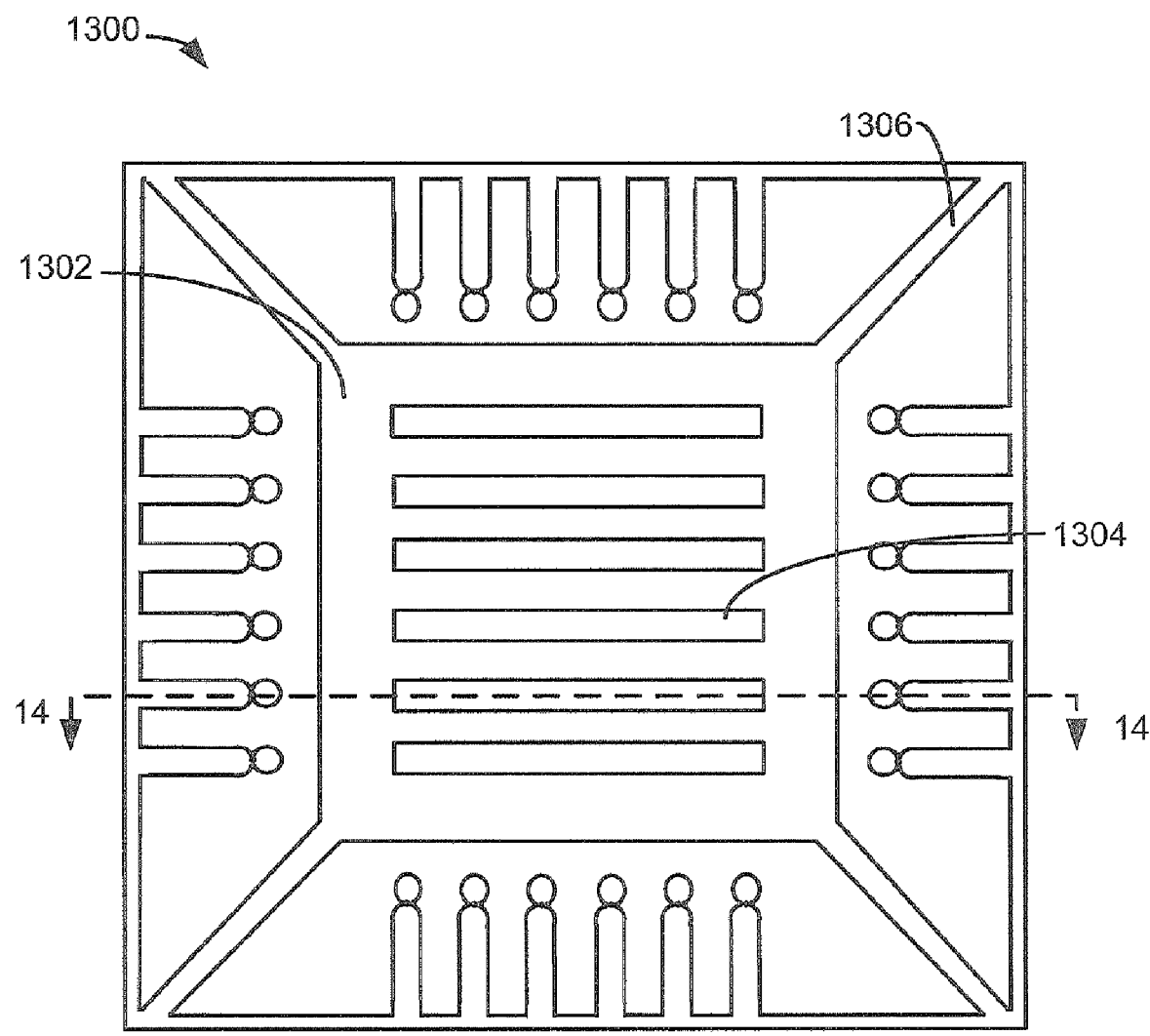
FIG. 13 is a plan view of an etched leadframe flipchip package system in yet another alternative embodiment of the present invention.

Referring now to FIG. 13, therein is shown a plan view of an etched leadframe flipchip package system 1300 in yet another alternative embodiment of the present invention. The plan view includes an etched die paddle 1302, having thermal interface bars 1304 and etched tie bars 1306. The etched die paddle 1302 and the etched tie bars 1306 are both subject to a chemical deflashing of the top surface, reducing their thickness by a range of 25 μm and 60 μm. The thermal interface bars 1304 remain their original thickness.

Figure 14:
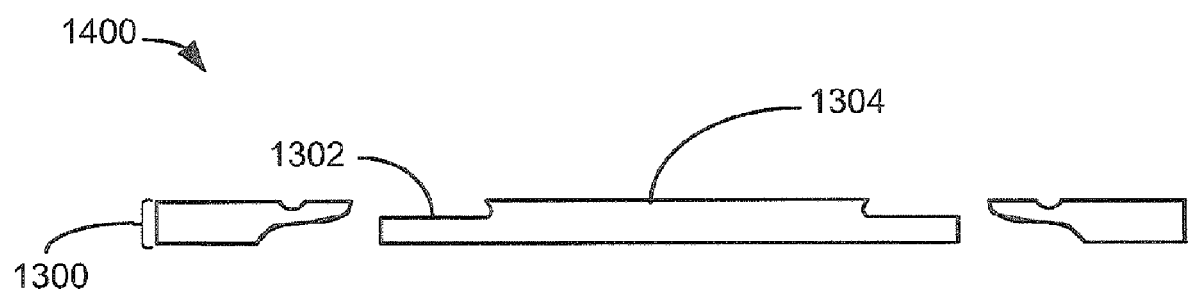
FIG. 14 is a cross-sectional view of the etched leadframe flipchip package system along the line 14-14 of FIG. 13.

Referring now to FIG. 14, therein is shown a cross-sectional view of the etched leadframe flipchip package system 1300 along the line 14-14 of FIG. 13. The cross-sectional view depicts the relative height of the etched die paddle 1302 and the thermal interface bars 1304. The chemical deflashing of the etched die paddle 1302 may reduce the thickness in the range of 25 μm and 60 μm. The thermal interface bars 1304 are shown as rectangles, but they may be of any shape that will align with the thermal interface of a flipchip integrated circuit (not shown) or integrated power device (not shown).

Figure 15:
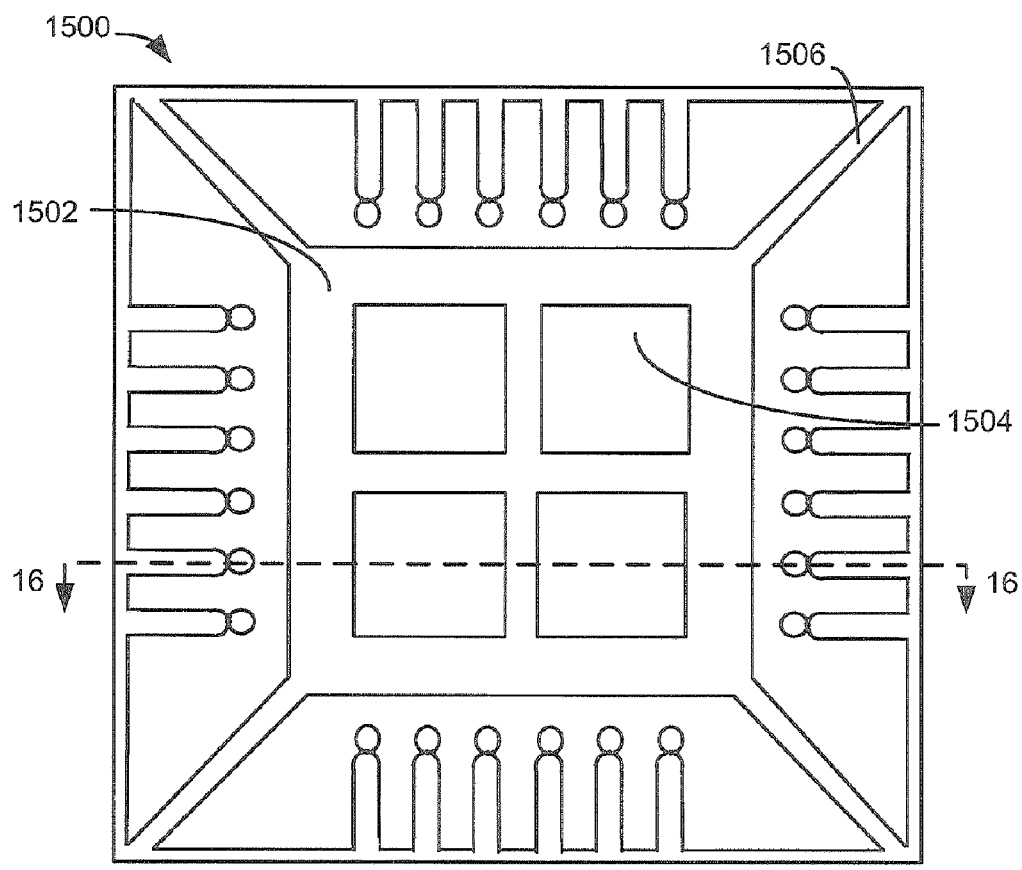
FIG. 15 is a plan view of an etched leadframe flipchip package system in yet another alternative embodiment of the present invention.

Referring now to FIG. 15, therein is shown a plan view of an etched leadframe flipchip package system 1500 in yet another alternative embodiment of the present invention. The plan view includes a chemically etched die paddle 1502, thermal pedestals 1504 and chemically etched tie bars 1506. The chemically etched die paddle 1502 and the chemically etched tie bars 1506 are both subject to a chemical deflashing of the top surface, reducing their thickness by a range of 25 μm and 60 μm. The thermal pedestals 1504 remain their original thickness.

Figure 16:
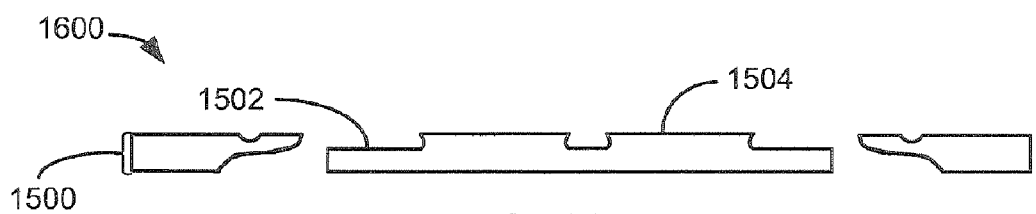
FIG. 16 is a cross-sectional view of the etched leadframe flipchip package system along the line 16-16 of FIG. 15.

Referring now to FIG. 16, therein is shown a cross-sectional view of the etched leadframe flipchip package system 1500 along the line 16-16 of FIG. 15. The cross-sectional view depicts the relative height of the chemically etched die paddle 1502 and the thermal pedestals 1504. The chemical deflashing of the chemically etched die paddle 1502 may reduce the thickness in the range of 25 μm and 60 μm. The thermal pedestals 1504 are shown as squares, but they may be of any shape that will align with the thermal interface of a flipchip integrated circuit (not shown) or integrated power device (not shown).

Figure 17:
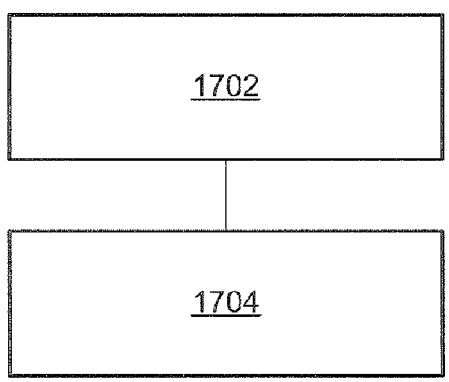
FIG. 17 is a flow chart of an etched leadframe package system for manufacturing of the etched leadframe flipchip package system in an embodiment of the present invention.

Referring now to FIG. 17, therein is shown a flow chart of an etched leadframe flipchip package system 1700 for manufacture of the etched leadframe flipchip package system 100 in an embodiment of the present invention. The system 1700 includes forming a leadframe comprises forming contact leads and etching the plurality of the multiple dotted grooves on the contact leads in a block 1702; and providing attaching a flipchip integrated circuit, having solder interconnects, to the leadframe, the solder interconnects on the contact leads between the multiple dotted grooves in a block 1704.

In greater detail, an etched leadframe flipchip package system in an embodiment of the present invention, is performed as follows:

(1) 1. Forming a leadframe further comprises, forming a die paddle, forming contact leads around the die paddle, wherein the contact leads and the die paddle are half etched, forming tie bars between the die paddle and the contact leads and etching the plurality of the multiple dotted grooves on the contact leads and the die paddle. (FIG. 1)

(2) 2. Attaching a flipchip integrated circuit to the contact leads further comprises attaching a solder interconnect between the flipchip integrated circuit and the leadframe. (FIG. 2)

(3) 3. Encasing in a molding compound, the leadframe and the flipchip integrated circuit further comprises forming a flipchip quad leadless package (FC-QLP). (FIG. 2)

It has been discovered that the present invention thus has numerous aspects.

It has been discovered that utilization of the etched leadframe flipchip package system provides a reliable package assembly that is easy to manufacture.

An aspect is that the present invention provides uniform solder connection by preventing solder ball collapse during the reflow process. The chemical deflashing of the top surface of the die paddle and the tie bars allows molding compound to readily flow around the leadframe and the integrated circuit.

Another aspect is the etched leadframe flipchip package system can be used to package active integrated circuits, integrated power devices and can include passive components within the package for either type of chip. This results in a very efficient and vertically thin package.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the etched leadframe flipchip package system method and apparatus of the present invention furnish important and heretofore unknown and unavailable solutions, capabilities, and functional aspects for producing a flipchip quad leadless package. The resulting processes and configurations are straightforward, cost-effective, uncomplicated, highly versatile and effective, can be implemented by adapting known technologies, and are thus readily suited for efficiently and economically manufacturing FC-QLP devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An etched leadframe flipchip package system comprising:
   forming a leadframe comprises:
      forming contact leads, and
      etching a plurality of multiple dotted grooves on the contact leads; and
   attaching a flipchip integrated circuit having solder interconnects on the contact leads between each of the plurality of the multiple dotted grooves.

2. The system as claimed in claim 1 further comprising forming a die paddle having a geometric shape of the multiple dotted grooves on the die paddle.

3. The system as claimed in claim 1 further comprising forming a solder isolation barrier with the multiple dotted grooves.

4. The system as claimed in claim 1 further comprising attaching a passive component to the contact leads, wherein the passive component is bordered by the multiple dotted grooves.

5. The system as claimed in claim 1 further comprising forming a heat sink for serving as a half etched die paddle, wherein the die paddle is half etched allowing a path for a molding compound.

6. An etched leadframe flipchip package system comprising:
   forming a leadframe comprises:
      half etching a die paddle,
      half etching contact leads around the die paddle,
      forming tie bars to the die paddle, and
      etching a plurality of multiple dotted grooves on the contact leads and the die paddle;
   attaching a flipchip integrated circuit having solder interconnects on the contact leads; and
   encasing the leadframe and the flipchip integrated circuit.

7. The system as claimed in claim 6 further comprising forming multiple dotted grooves in a configuration on the die paddle for preventing seepage of the solder interconnects.

8. The system as claimed in claim 6 further comprising forming a solder isolation barrier with the plurality of the multiple dotted grooves to prevent the solder interconnects from collapsing.

9. The system as claimed in claim 6 further comprising attaching a passive component to the contact leads, wherein the passive component is bordered by the plurality of the multiple dotted grooves.

10. The system as claimed in claim 6 further comprising forming a thermal contact on the die paddle by etching of the top surface, where the etching forms a path for the molding compound.

11. An etched leadframe flipchip package system comprising:
    a leadframe further comprises:
       contact leads, and
       a plurality of multiple dotted grooves etched on the contact leads; and
    a flipchip integrated circuit having solder interconnects on the contact leads between the plurality of the multiple dotted grooves.

12. The system as claimed in claim 11 wherein the plurality of the multiple dotted grooves on the die paddle form a geometric shape.

13. The system as claimed in claim 11 further comprising a solder isolation barrier, wherein the solder isolation barrier comprises the plurality of the multiple dotted grooves on the die paddle.

14. The system as claimed in claim 11 further comprising a passive component attached to the contact leads, wherein the passive component is bordered by the plurality of the multiple dotted grooves.

15. The system as claimed in claim 11 further comprising a heat sink formed by etching the top surface of the die paddle, the heat sink comprising solder interconnects between the die paddle and the flipchip integrated circuit.

16. The system as claimed in claim 11 further comprising:
    a die paddle and the contact leads half etched;
    tie bars formed to the die paddle; and
    a flipchip quad leadless package having the flipchip integrated circuit and the leadframe encased in a molding compound.

17. The system as claimed in claim 16 further comprising a geometric shape defined by each of the plurality of the multiple dotted grooves on the die paddle.

18. The system as claimed in claim 16 further comprising a solder isolation barrier, wherein the solder isolation barrier comprises the plurality of the multiple dotted grooves to prevent the solder interconnects from collapsing.

19. The system as claimed in claim 16 further comprising a passive component attached to the contact leads, wherein the passive component is bordered by the plurality of the multiple dotted grooves.

20. The system as claimed in claim 16 further comprising a heat sink formed by etching the top surface of the die paddle, wherein the heat sink comprises solder interconnects between the die paddle and the flipchip integrated circuit that allow a flow of molding compound.

* * * * *